United States Patent [19]

Southworth et al.

[11] Patent Number: 4,682,927

[45] Date of Patent: Jul. 28, 1987

[54] CONVEYOR SYSTEM

[75] Inventors: Peter R. Southworth, Mission Viejo; Gregory R. Baxter, Orange, both of Calif.

[73] Assignee: Nacom Industries, Incorporated, Tustin, Calif.

[21] Appl. No.: 672,349

[22] Filed: Nov. 16, 1984

Related U.S. Application Data

[63] Continuation-in-part of Ser. No. 517,278, Jul. 26, 1983, abandoned, which is a continuation-in-part of Ser. No. 419,201, Sep. 17, 1982, Pat. No. 4,540,326.

[51] Int. Cl.⁴ .............................................. B65G 35/00
[52] U.S. Cl. .................................. 414/217; 198/950; 414/608; 414/225; 414/662
[58] Field of Search .............. 414/217, 222, 225, 277, 414/282, 662, 663, 664, 592, 608, 609, 786, 287, 292, 564; 198/950; 406/1, 2, 3; 186/7, 35, 36, 37, 55, 56, 58; 55/385 A; 198/619, 805; 104/138 R, 154, 165, 277, 278; 105/365

[56] References Cited

U.S. PATENT DOCUMENTS

| | | |
|---|---|---|
| 516,188 | 3/1894 | Dewey . |
| 1,171,972 | 2/1916 | Myers .................................. 46/235 |
| 2,609,915 | 9/1952 | De Burgh .......................... 198/619 |
| 2,900,046 | 8/1959 | Bailey .................................. 186/35 |
| 2,925,886 | 2/1960 | Grondona et al. ............. 414/564 X |
| 3,337,069 | 8/1967 | Burger ............................ 414/564 X |
| 3,774,548 | 11/1973 | Borst .................................. 105/30 |
| 3,782,563 | 1/1974 | Brockmeyer et al. .......... 414/609 X |
| 3,851,778 | 12/1974 | Schurch ............................... 414/609 |
| 3,882,791 | 5/1975 | Youngscap ..................... 104/287 X |
| 3,902,427 | 9/1975 | Kastenbein ..................... 414/609 X |
| 3,922,970 | 12/1975 | Glastra ............................ 104/247 X |
| 4,015,537 | 4/1977 | Graef et al. ......................... 186/7 X |
| 4,193,732 | 3/1980 | Vetter et al. ......................... 414/609 |
| 4,195,962 | 4/1980 | Laskowski et al. ............. 414/592 X |
| 4,231,294 | 11/1980 | Arzoumanian .................. 104/138 R |
| 4,389,967 | 6/1983 | Shimoda et al. ................ 105/365 X |
| 4,392,435 | 7/1983 | Moody et al. ...................... 104/284 |
| 4,409,889 | 10/1983 | Burleson ............................ 55/385 A |
| 4,416,202 | 11/1983 | Rooklyn ......................... 104/247 X |
| 4,540,326 | 9/1985 | Southworth et al. ............... 414/217 |
| 4,544,318 | 10/1985 | Nagatomo et al. ............. 198/346 X |

FOREIGN PATENT DOCUMENTS

| | | |
|---|---|---|
| 1813995 | 12/1969 | Fed. Rep. of Germany . |
| 2741895 | 3/1979 | Fed. Rep. of Germany . |
| 83422 | 6/1964 | France . |
| 2000736 | 1/1979 | United Kingdom . |

OTHER PUBLICATIONS

Namtrak Wafer Cassette Transporter; May 1983, Brochure: 285283A.
Technical Supporting Document; Price List: 031257B; date: 11/18/82.
Air Flow Amplifier Information, Vortec Corporation.

Primary Examiner—L. J. Paperner
Assistant Examiner—Stuart J. Millman
Attorney, Agent, or Firm—Knobbe, Martens, Olson & Bear

[57] ABSTRACT

Apparatus for automatically transferring a cassette of semiconductor wafers from one "clean" room to a second "clean" room across an area that may be less clean. The system includes an elevator in each room where a load is manually positioned in a load stall, and is then withdrawn automatically to an elevator and moved to a different elevation and transferred to an enclosed horizontal conveyor at that elevation which spans the distance between the "clean" rooms. The load then moves on a driven cart which straddles, and is magnetically coupled to an enclosed driver cart. The conveyor and the elevator stations are pressurized with clean air to maintain the necessary cleanliness for the wafer processing operation.

28 Claims, 15 Drawing Figures

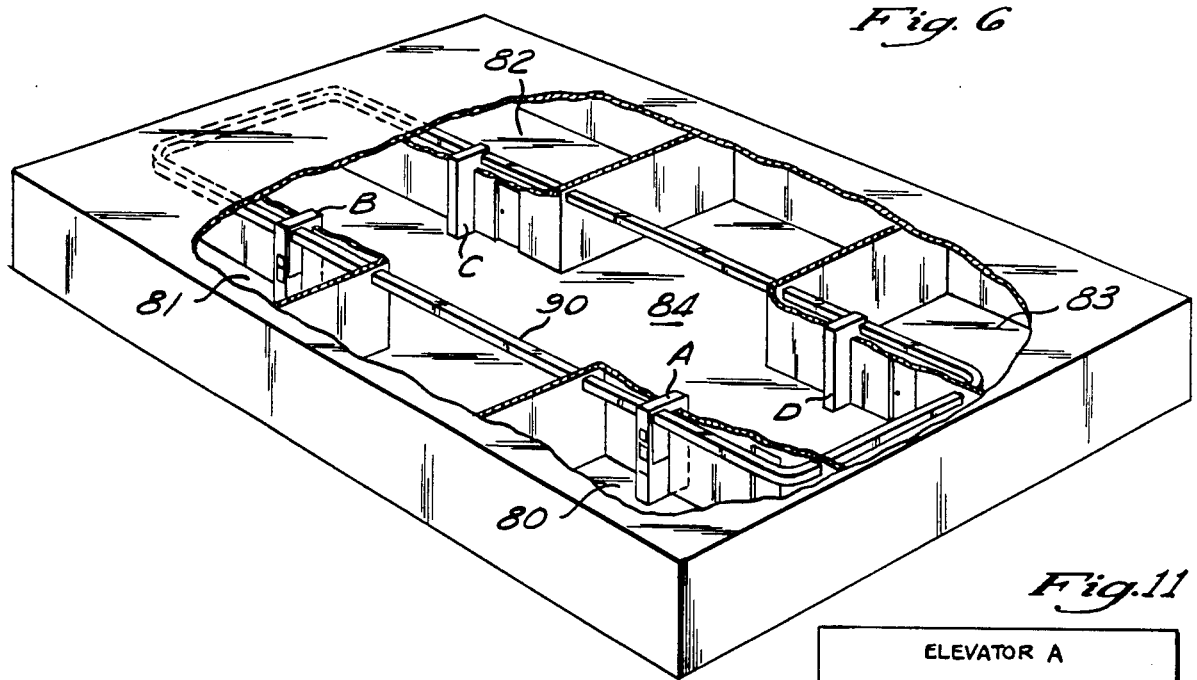
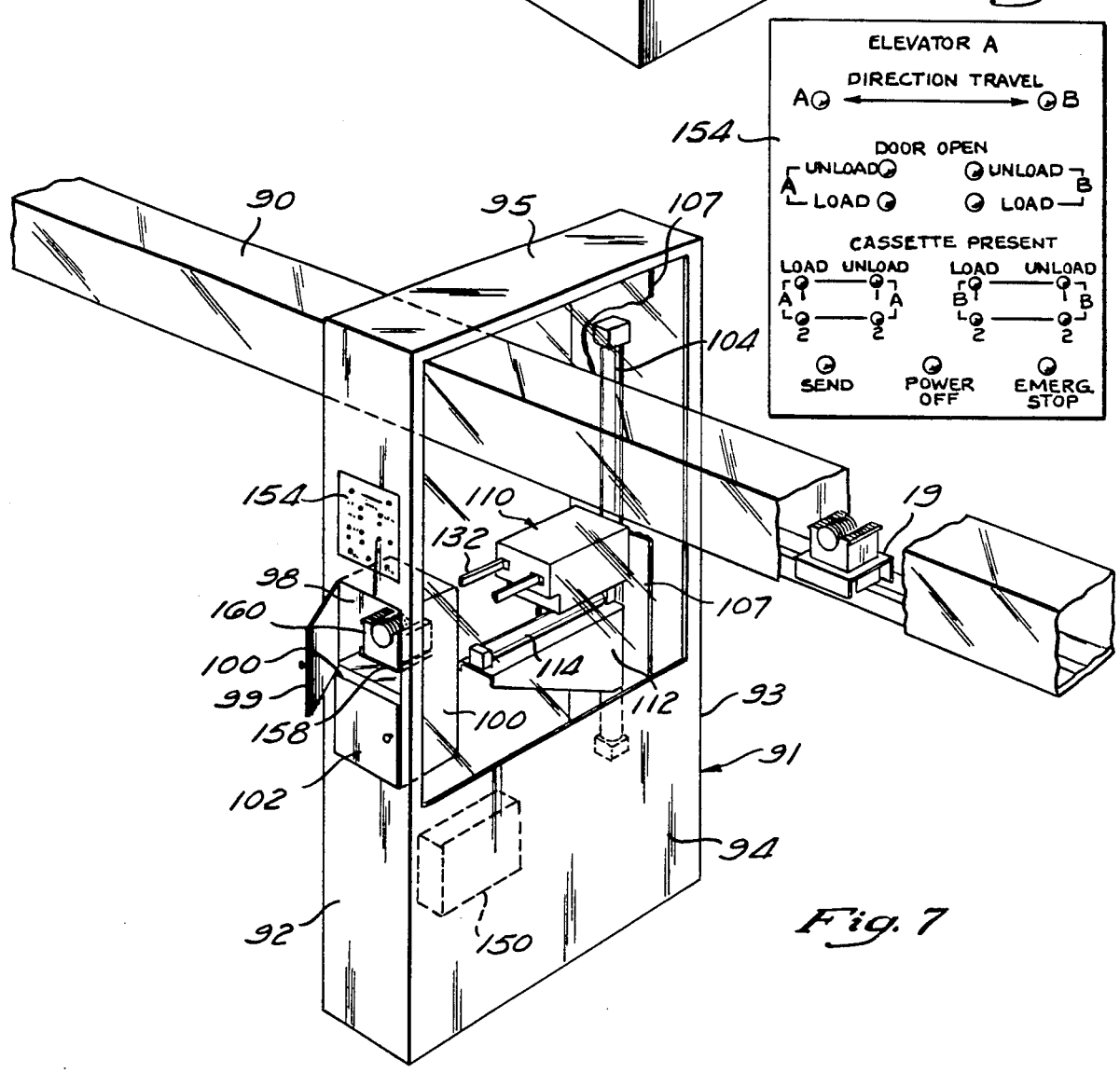

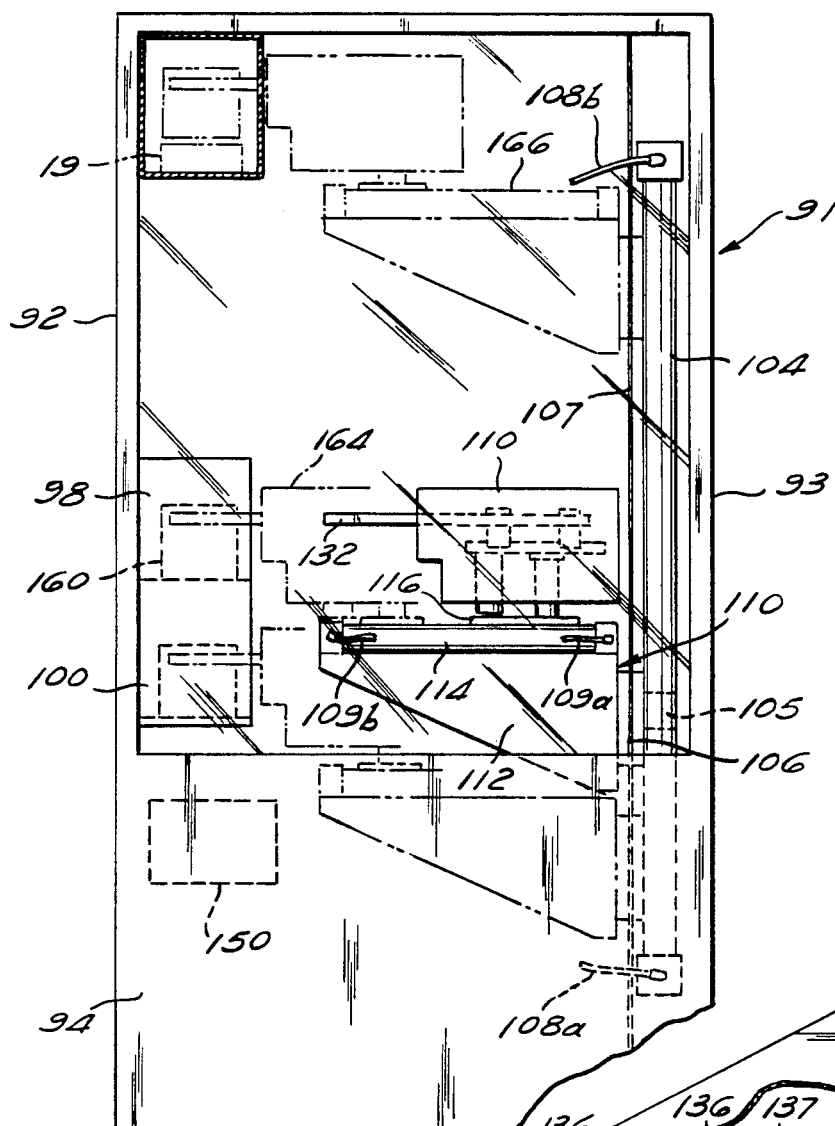
Fig. 8
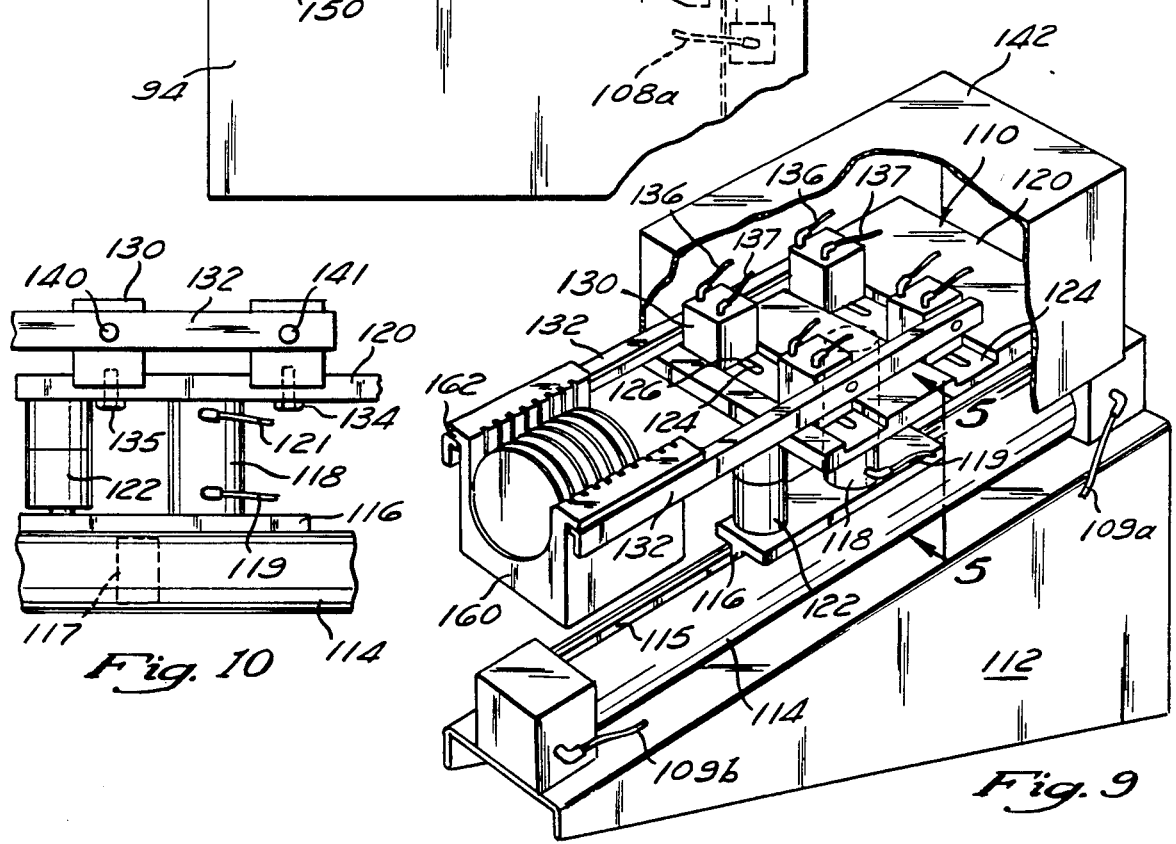
Fig. 10
Fig. 9

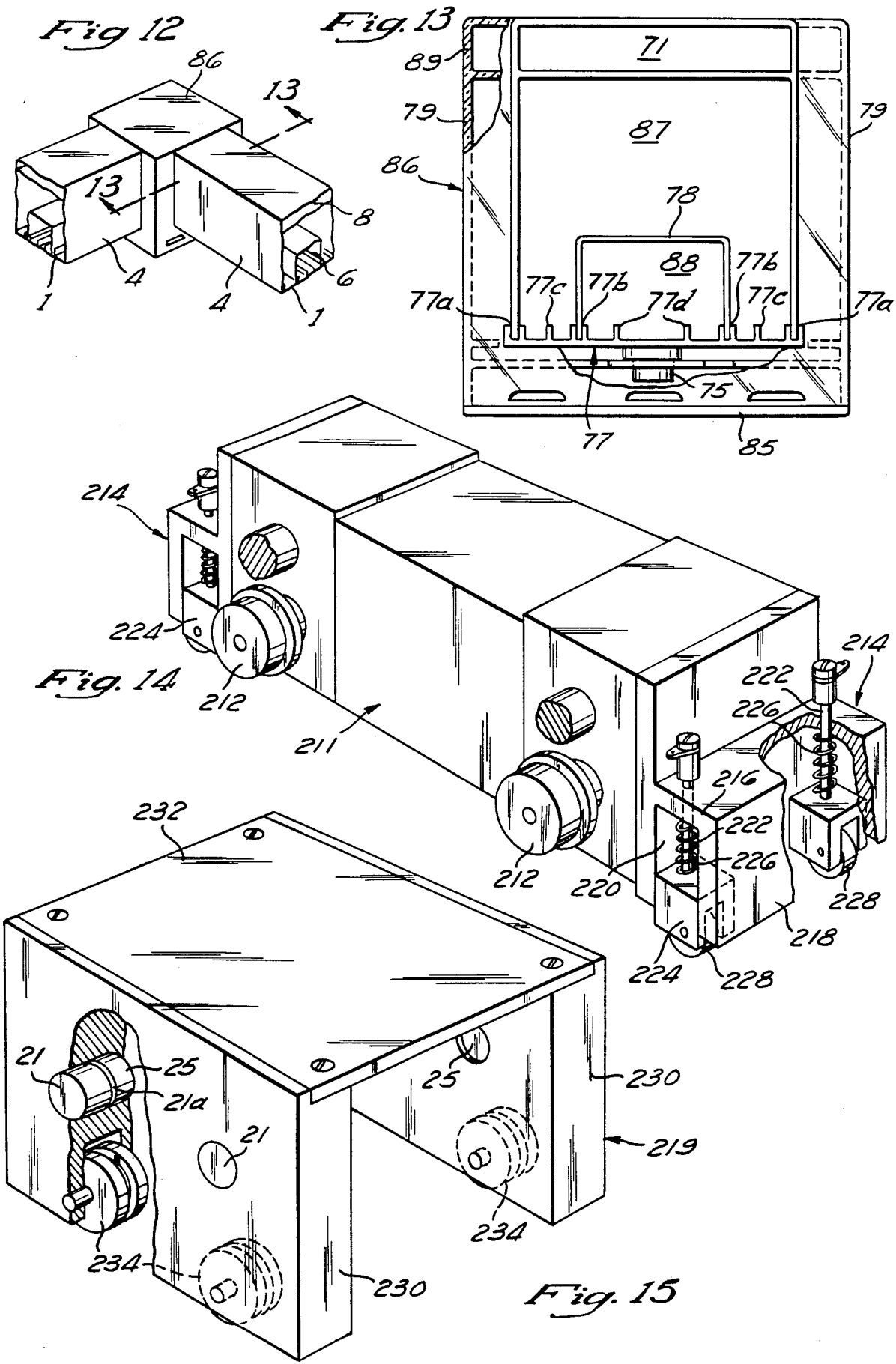

CONVEYOR SYSTEM

RELATED APPLICATION

This invention is a continuation-in-part of U.S. patent application, Ser. No. 517,278, filed July 26, 1983 now abandoned, which is a continuation-in-part of U.S. patent application Ser. No. 419,201, filed Sept. 17, 1982 now issued as U.S. Pat. No. 4,540,326, on Sept. 10, 1985.

BACKGROUND OF THE INVENTION

This invention relates to automatic transfer apparatus that is particularly useful in situations in which a workload must be handled in a clean environment, such as in the semiconductor industry. In the semiconductor industry, carriers or cassettes of semiconductor wafers are transferred to many different work stations for various processing steps. Extreme cleanliness is required during these steps and in processing the wafers in order to improve the yield of an acceptable product. A multitude of extremely small and complex circuits are formed on the wafers. It only takes a small particle of dust or other contaminant to either short circuit the imprinted circuitry or to block processing chemicals from reaching every portion of the circuitry imprinted on the wafer. Because of the cost of semiconductor devices and the cost of the systems and equipment in which such devices are used, it is extremely important that the necessary quality levels be attained.

Currently, the various processing steps are typically conducted in "clean rooms" wherein the environment is controlled to keep contaminates below a certain predetermined level. One difficulty that arises is the method of keeping the wafers clean when being moved from one processing area to another. Because of the many steps involved, it is usually impractical or impossible to arrange them all in a continuous sequence or in a single room wherein the entire operation is conveniently maintained in a single clean environment. Instead, in moving from one area to another, it is usually necessary to cross areas not having an environment which is controlled to the necessary levels. Typically, the work in process is manually transported to the next work station and the wafers are covered in some manner, such as a box, that will hopefully maintain the necessary cleanliness. This approach is, in general, not very satisfactory and results in a lower yield of acceptable product. Manual handling often also results in damage to the fragile wafers.

Early attempts to automate the transport process by the use of conveyor belts and platens or by air or by vibratory tracks did not solve either the contamination or the abrasion problem. Conveyor systems subject the wafers to numerous vibratory loads. The air transport systems increase the risk of contamination through the very air used to transport the wafers. Vibratory tracks increase the abrasion of the wafers and platen conveyor systems subject the wafers to numerous vibrations as they are rolled over each platen, thereby increasing the chances of abrasion and increasing the shock loads tending to fracture the wafers.

U.S. Pat. No. 4,540,326 discloses an enclosed horizontal conveyor system that is capable of properly moving a load of wafers from one processing area to another in a manner that does not damage the wafers and maintains the necessary cleanliness. This system is disclosed in the drawings and description of the present application. As a supplement to that system, a need exists for locating the horizontal conveyor system and for providing automated means for inserting and withdrawing loads from the horizontal conveyor.

SUMMARY OF THE INVENTION

In accordance with this invention, a system is provided for automatically transferring a cassette of semiconductor wafers, or other load from one "clean" room to another in a manner that maintains the necessary cleanliness during transfer and also in a manner that does not interfere with other work flow operations. A horizontal conveyor system of the type referred to in the U.S. Pat. No. 4,540,326 and as described in application having Ser. No. 517,278 extends between the two "clean" rooms, typically passing through a work area that is not maintained at the cleanliness level equal to that of the "clean" room in which the load is processed. To prevent interference with other operations both in the clean room and in the area between the clean rooms, the horizontal conveyor is placed above work areas. Typically, the height of work rooms in industrial facilities is at least nine feet, such that there is ample room for positioning the horizontal conveyor on that level without restricting other activities below. Alternatively, a below floor position could be utilized, if that should fit a particular facility better.

In each room in which it is desired to insert or remove loads into or from the horizontal conveyer, there is positioned a work transfer or elevator station including elevator means for raising and lowering the load from a work height level to the level of the conveyor. More specifically, at each station there is positioned a vertically extending enclosure having a door in one wall opening into a stall within the enclosure in which is positioned the load to be transferred. The horizontal conveyor passes through the upper portion of the enclosure adjacent the wall in which the door is located and spaced upwardly from the load support. The elevator is located on the wall opposite from the door and includes a transfer mechanism which is mounted for vertical movement by the elevator. The transfer mechanism may also include a robotics assembly for extending into the stall, gripping, lifting and retracting the load before it is moved to the level of the horizontal conveyor where the robotics assembly then positions the load in the conveyor.

Suitable computerized control means may be provided for controlling the sequence of movements by which the load is transferred, or the system can be controlled manually. Each enclosure is provided with a one or more load receiving stall and unloading stalls so that more than one load may be handled by the system at a single time. Along with the computerized control, there is provided a control panel having suitable indicators that will tell the users of the system when a load is ready to be removed from an enclosure and when a station is ready to receive a new load. Suitable interlocks are provided to prevent operator interference with loads.

The enclosures and the horizontal conveyor system are designed to generate fewer particles than other systems, to contain the particles which are generated, and to keep the generated particles away from the wafers. Thus, the various parts, especially the moving parts of the system are designed to generate very few particles. These design objectives are accomplished by magnetically coupling driven and driver carts through a cover which encloses the driver cart in the horizontal conveyor so that the load on the driver cart is not subjected to the particles generated by the motor on the driver cart. The elevators preferably use piston and cylinder arrangements powered by air pressure to reduce particulate generation. The mechanical parts of the elevators are preferably covered to prevent particles from escaping. Low outgassing lubricants, and positive pressurization and suction of select areas also inhibits contamination.

Each of the enclosures as well as the horizontal conveyor are constantly maintained under a positive pressure of clean air or other inert gas to make certain that the necessary level of cleanliness is automatically provided throughout the conveyor system.

BRIEF DESCRIPTION OF THE DRAWINGS

FIG. 6 is a perspective schematic view illustrating the conveyor system of the invention as positioned in an exemplary working facility.

FIG. 7 is a perspective schematic view of one elevator station with a portion of the horizontal conveyor system;

FIG. 8 is a side elevational view of the elevator station of FIG. 7 illustrating the movement of a robotics assembly on the elevator in transferring a cassette of wafers;

FIG. 9 is a perspective view of the assembly of FIG. 8 showing the manner in which the cassette of wafers is lifted and moved;

FIG. 10 is a cross sectional view on line 5—5 of FIG. 9 further illustrating the robotics assembly;

FIG. 11 is a schematic view of the control panel for the system;

FIG. 12 is a perspective view of a turntable of this invention connected between two track segments;

FIG. 13 is a cross sectional view along 13—13 of FIG. 12, showing the turntable of this invention;

FIG. 14 is a perspective view of a single segment driver cart with an alternate embodiment of an electrical pickup assembly; and FIG. 15 is a perspective view of a single segment driven cart of this invention.

DETAILED DESCRIPTION

Figure 1:
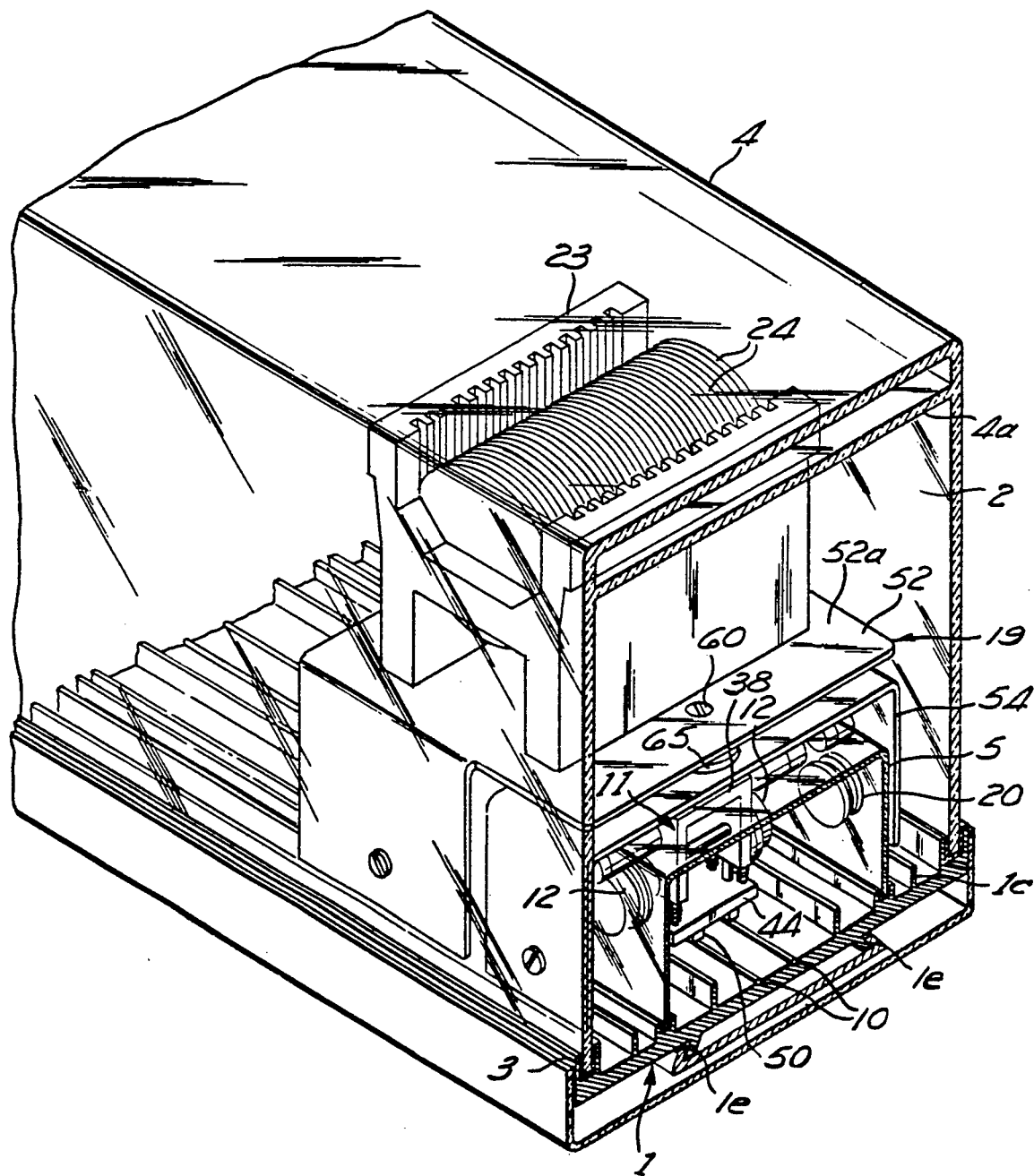
FIG. 1 is a cross sectional view of the tunnels and carts of the conveyor system of the invention, showing the driven cart straddling the driver cart and showing a cutaway view of the electrical power pickup.
Figure 2:
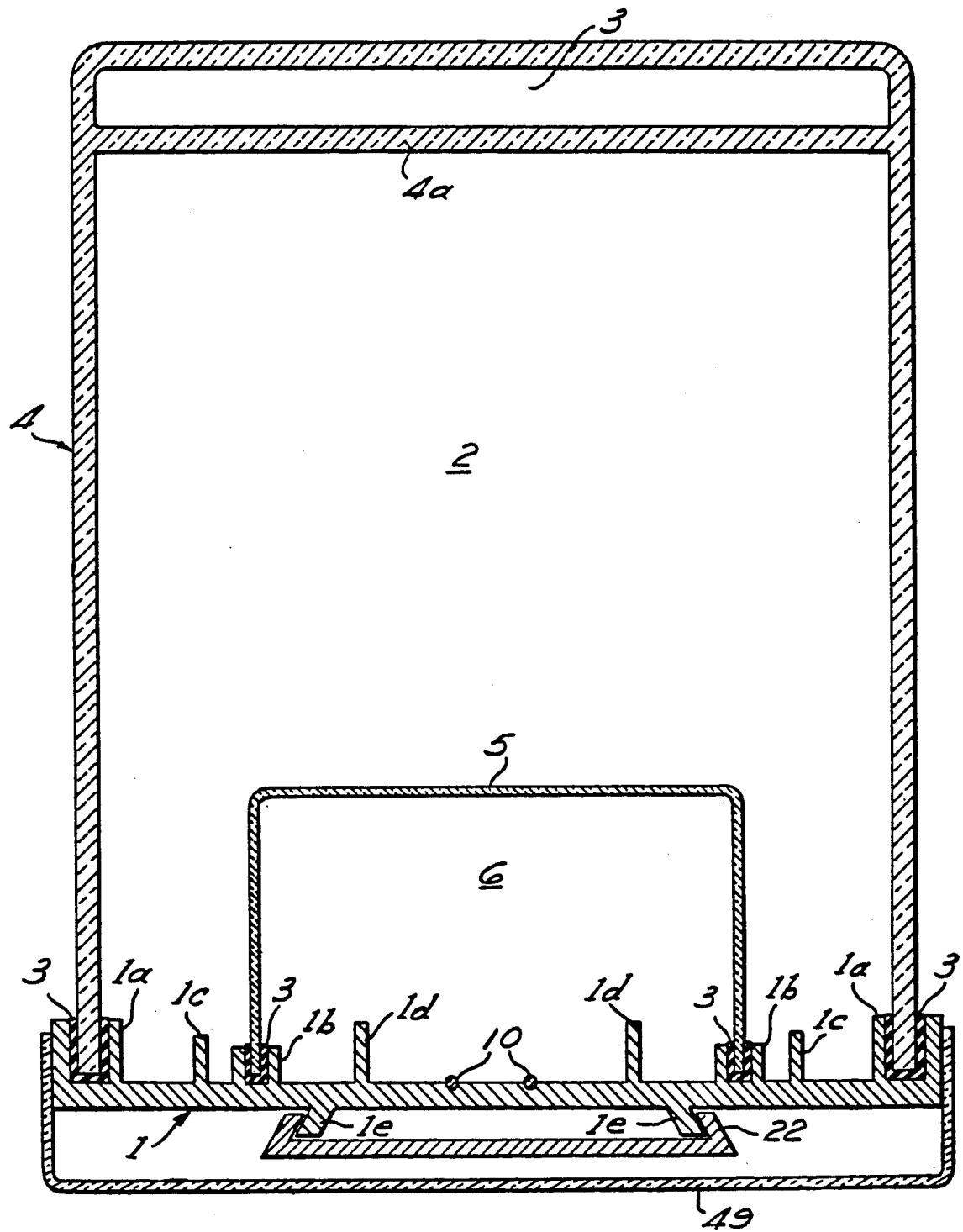
FIG. 2 is a cross sectional view of the cover and support structure forming the tunnels of FIG. 1.

Referring to FIGS. 1 and 2, there is shown an elongated tunnel track segment including a track like support structure or track 1, which is preferably formed as a one-piece extrusion of aluminum or other suitable material. The upper surface of track 1 has a Teflon impregnated, hard anodized finish to reduce friction and to reduce the number of particles generated by the track 1. As may be seen, the track 1 is formed on its upper surface with a series of short upstanding walls, 1a–1d. A pair of outer walls 1a on each of the outer edges of the upper surface of the track 1 form a U-shaped groove along each outer edge for receiving the side walls of a large, generally U-shaped outer cover 4, which is preferably made of sheet metal. Together, the track 1 and the cover 4 form an outer tunnel 2.

A horizontal wall 4a located near the top of outer cover 4 and formed integral therewith forms a plenum 8. Pressurized gas, such as air is forced through the plenum 8 and through apertures (not shown) in wall 4a in order to pressurize outer tunnel 2.

The upper surface of track 1 is further formed with two sets of inner walls 1b that form a pair of spaced grooves for receiving the sides of a U-shaped inner cover 5. The cover 5 in combination with the track 1 forms an inner tunnel 6 which is smaller than, and contained within, the outer cover 4 and tunnel 2. Suitable U-shaped seals 3 positioned in the grooves formed by the walls 1a and 1b cooperate with the lower edge of the cover side walls to seal the tunnels 2 and 6.

The track walls 1c form a pair of outer rails (hereinafter outer rails 1c) for receiving the wheels of an outer driven cart 1a, and the track walls 1d form a pair of inner rails (hereinafter inner rails 1d) for receiving the wheels of an inner driven cart. Note that the outer rails 1c are located between the grooves for the inner and outer covers, 1b and 1a respectively, and the inner rails 1d are located within the inner cover 5.

Also formed in the upper side of the track 1, between the inner rails 1d, are a pair of grooves 7 receiving electrical conductors 10. The conductors 10 provide for electrical power take off along the length of the track. As previously mentioned, the aluminum track 1 is hard anodized, which renders the exterior surface nonconductive, and thus the bare conductors 10 may be positioned directly in the grooves 7. The conductors 10 can alternatively be printed directly on to the surface of track to form a conductor analogous to a printed circuit.

The track 1 is further formed with a pair of elongated ribs 1e which depend downwardly and outwardly from the lower surface of the track 1 and interlock with corresponding channel-shaped connection pieces 22 for joining two segments of the track 1 in end-to-end alignment.

Figure 3:
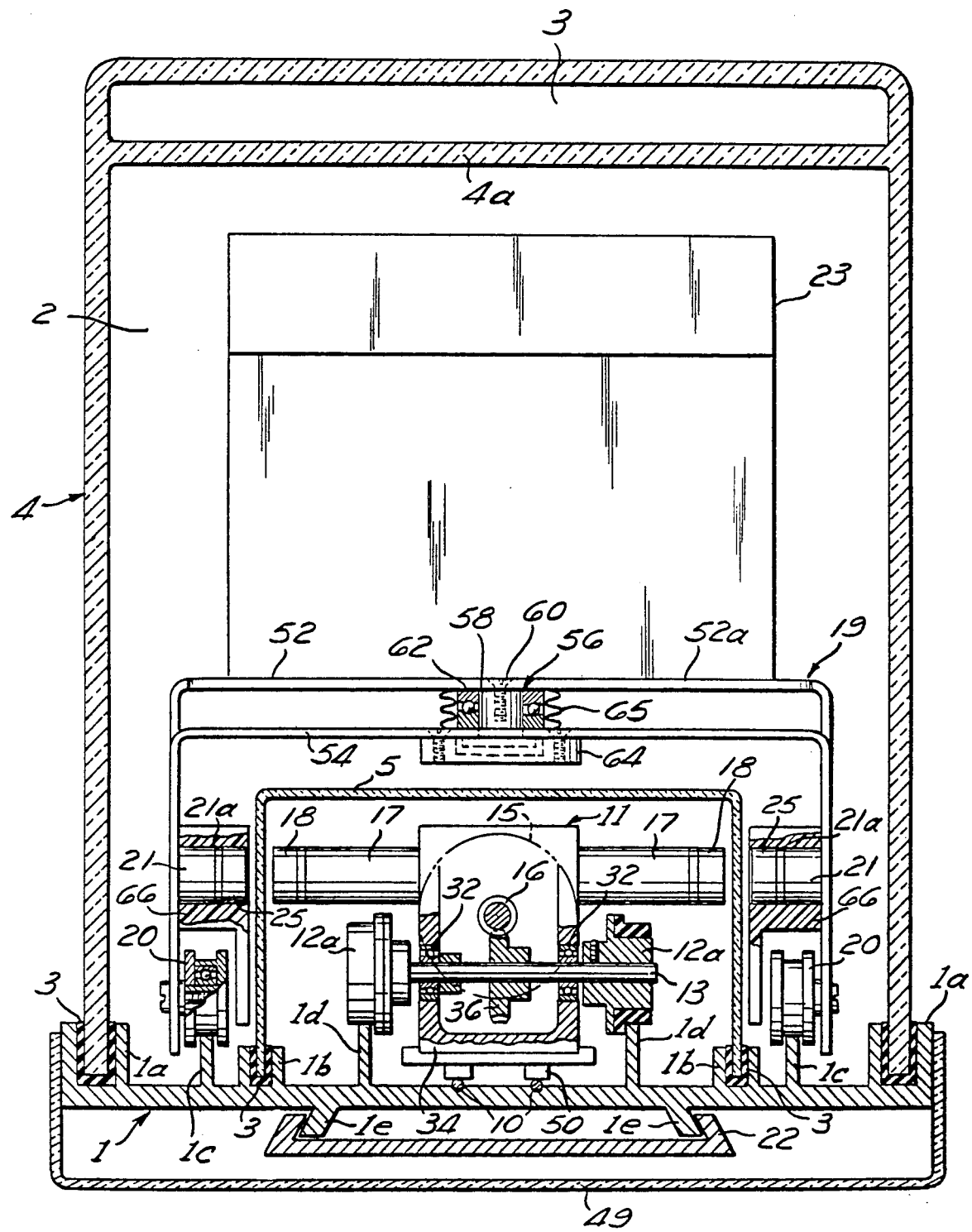
FIG. 3 is a sectional view, showing the driver cart and the driven cart within the tunnels.
Figure 4:
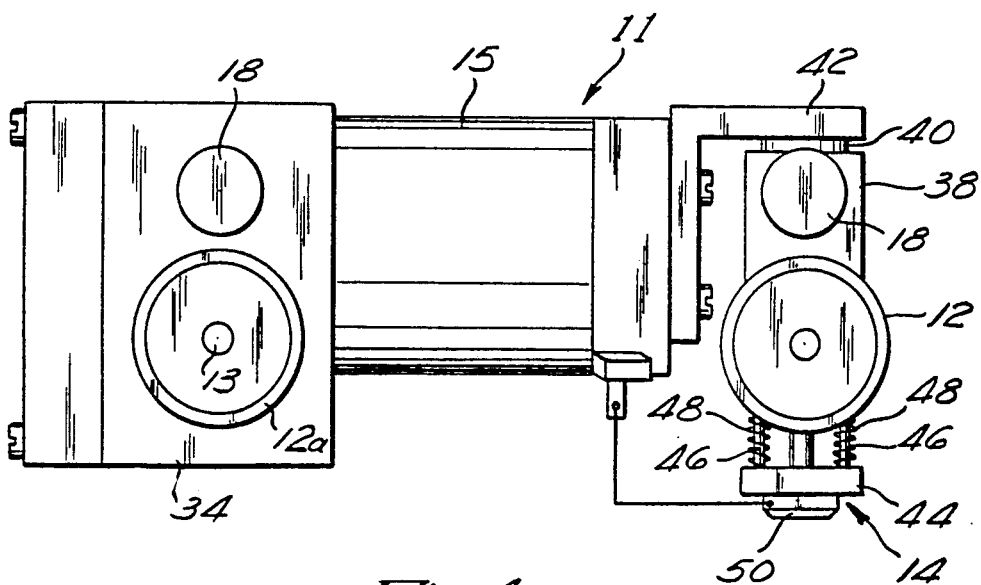
FIG. 4 is a side elevational view of the inner cart.

Referring now to FIG. 3, as well as FIGS. 1 and 4, there is shown an outer driven cart 19 straddling the cover 5 which encloses the inner driver cart 11. The driver cart 11 is mounted on four single flanged wheels 12 which ride on the inner rails 1d. Two of the wheels 12 are mounted on bearings which allow free rotation of the wheels, and the other two wheels 12a are rigidly mounted to a driver axle 13 to form drive wheels. The wheels 12 have an exterior covering of urethane or other suitable material that provides the necessary frictional engagement with the inner rails 1d while minimizing particulate generation. The axle 13 is rotatably mounted on suitable bearings 32 mounted on a gear housing 34 connected to an electric motor 15. The motor drive shaft (not shown) carries a worm gear 16 which drives a worm wheel 36 mounted on the axle 13 to propel the driver cart 11. The cart 11 is preferably formed of two segments to allow it to accommodate a curve. The axle 13 and its wheels 12a, together with the housing 34 and motor 15, form a drive segment. The other set of wheels 12 are mounted on a U-shaped yoke 38 which is pivotally mounted by a bearing 40 to a pivot bracket 42 attached to the motor 15. Thus, the yoke 38, together with its wheels, can pivot about a vertical axis independently of the drive segment.

Also mounted on the pivotable segment of driver cart 11 is an electric pickup assembly 14 for providing power to the motor 15. As seen from FIGS. 1 and 4, the power pickup assembly 14 includes a plate 44 slideably mounted on four pins 46 supported in the lower ends of the yoke 38, and retained by two screws. Springs 48 surrounding the pins 46 urge the plate downwardly so that a pair of contact shoes 50 are continuously urged into slidable contact with the conductors 10. The contact shoes 50 are, of course, connected by a suitable conductor to the motor 15.

The electrical connections (not shown) bringing power to the conductors 10 may conveniently be located beneath the track 1 in an enclosed space 51 formed by a lower channel like cover 49, which is secured to the track 1, and also forms a support surface for the system. Other electrical controls (not shown) for controlling the movement of the driver carts may be conveniently housed in the space 51. The cover 49 also encloses the connecting pieces 22 which join sections of track 1.

Referring to FIG. 3, four post like arms 17 are located one above each of the wheels 12 and 12a. At the end of each arm 17 is mounted a rare earth magnet 18. The length of the arms 17 is such as to place the magnets 18 in close proximity to the sides of the inner cover 5. Inner cover 5 is of magnetically permeable material, such as corrosion resistant steel. (The arms and magnets above the pivot wheel segment of the cart 11 are not shown in FIG. 1 so as to simplify that drawing.)

Referring to FIGS. 1-3, the driven cart 19 has a segmented construction supported on four double flanged wheels 20 which in turn ride on the outer rails 1c of the track 1. The driven cart 19 includes two U-shaped yokes 52 and 54 which straddle the inner cover 5 and the driven cart 11, with two wheels being mounted on stub shafts mounted on the inside of the side walls of each yoke. The yoke 52 includes a flat upper plate 52a for supporting a load, such as a cassette or carrier 23 holding a group of semiconductor wafers 24. The yoke 54 is pivotally mounted on a thrust bearing 56 secured to a portion of the plate 52a extending over the yoke 54. The thrust bearing permits the yoke 54 to pivot independently of the yoke 52 so that the cart can negotiate curved tracks, with a minimum of sliding wheel contact. This minimized sliding reduces the generation of particulate contaminants which would have an adverse effect should they come in contact with the wafers 24.

The driven cart wheels 20 are mounted on special double sealed bearings having sealed therein a low out gassing lubricant. Such a bearing not only permits each wheel to rotate freely on its axle with low friction, but also is a very low generator of particulate matter that might contaminate the wafers.

The wheels 20 are made of urethane which is corrosion resistant, has a very low coefficient of friction and is extremely durable, providing superior wear characteristics to prevent contaminant generation in the wafer area. In addition to the cleanliness aspect, reliable, uniform movement of the driver cart is, of course, important. Some materials tend to produce particles that interfere with the smooth rotation of wheels, such that with the magnetic drive arrangement, jerky movement of the cart may occur or actual stalling. Unreliability is unacceptable, and jerks or jolts may damage the delicate wafers.

The bearing 56 includes a bearing bushing 58 which extends through the yoke 54 and is secured to the yoke 52 by a fastener 60. A bearing element 62 surrounds the bushing 58 and extends between the yokes 52 and 54, holding them in spaced relation, with the head of the bushing 58 engaging the under surface of the yoke 54. A cap 64 secured to the yoke 54 enables the head of the bushing to capture any particulates generated by the sliding contact between the bushing head and the yoke 54. A Teflon bellows 65 surrounding the bushing shank and the element 62 engages the yokes 52 and 54 to confine any particulates generated in that area, while not interfering with the movement of the components.

Referring to FIG. 3, suitable plastic shields 66 attached to the inner sides of the yoke side walls enclose each of the wheels 20 on the driven cart 19. Such shields deflect any particles downward, away from the wafer carrier 23. (The shields are not shown in FIG. 1, to simplify that figure.)

Each of the shields 66 also supports a rare earth magnet 25, a steel spacer 21a, and a spacer plug 21. The size of the plugs 21 and the magnets 25 is such as to place the magnets in close proximity to the sides of the inner cover 5. The spacing and location of the four magnets 25 is such as to cause the magnets 25 to be aligned with the magnets on the driver cart 11, such that the only thing separating magnets 18 from magnets 25 is the magnetically permeable inner cover 5, a small air gap on either side of said inner cover 5 and a thin layer of plastic on the face of the magnets 25, the latter to prevent particles from leaving the magnet surface.

The magnets 25 and 18 are located on the sides of the driven car 11 and driven cart 19, rather than the top of said cart, so that the magnetic force coupling the carts can be balanced along the rotational axis of the wheels 12 and 20. Proper positioning of the magnets 25 and 18 results in a magnetic force which centers the wheels 12 and 20 on their respective inner and outer rails 1c and 1d. Centering the wheels on the rails minimizes abrasion and particle generation as the flanges on the wheels 12 and 20 rub against the inner and outer rails 1c and 1d respectively. Thus, the magnetic force coupling the driven cart 19 to the driven cart 11 preferably occurs along the sides of the carts rather than through the tops of the carts.

Still referring to FIG. 1, note that the carrier 23 mounted on the driven cart 19 holds the semiconductor wafers 24 which are shown in an edge view in FIG. 3. Orienting the semiconductor wafers 24 with the edge located along the direction of travel of the driven cart 19 is the preferred orientation since the forces exerted by stopping and starting the cart 19 will act along the strongest axis of the semiconductor wafers 24, thus minimizing possibilities of wafer damage.

From the foregoing, it may be seen that the driven cart 19 with its load of wafers moves in a contaminant free, sealed tunnel 2. Where sections of the covers 4 and 5 forming the tunnel are joined at their ends, suitable seal elements (not shown) may be employed to reduce leakage in that area. Positive pressurization of the tunnel 2 is achieved by transporting filtered air or nitrogen through the plenum 8 formed in the top of the outer cover 4 and distributing the gas downwardly through suitable openings (not shown) in the wall 4a. Suitable vents (not shown) in the lower portion of the tunnel 2 permit a controlled flow of the purging gas downwardly in the tunnel directing any particulates formed by the carts away from the wafers. Positive pressurization of the tunnel 2 also, of course, prevents atmospheric contaminants from entering the outer tunnel 2 and prevents contaminants from escaping the area enclosed by the inner cover 6.

Figure 5:
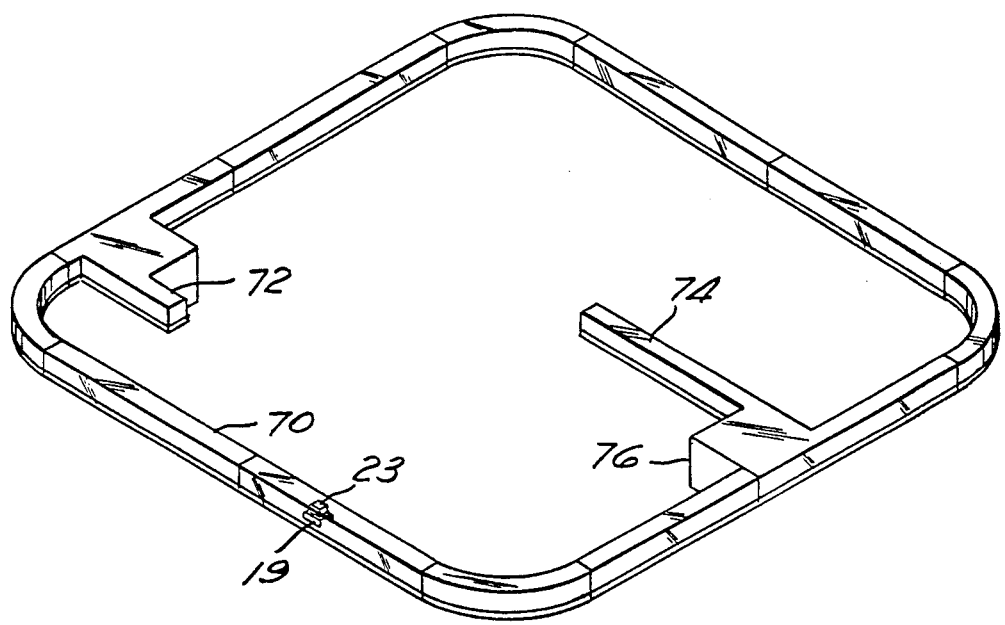
FIG. 5 is a schematic view illustrating the transport system of the invention having straight and curved segments, as well as a carrier transfer device.

FIG. 5 illustrates a series of tunnel sections or modules interconnected in end-to-end relation to form a closed loop 70. The straight and curved sections can be arranged in any desired pattern to meet the various needs of a processing operation. Typically, the tunnel modules are made in eight foot lengths and the curved sections have a three foot radius which enables the carts to turn corners without jostling the wafers or unduly generating particulates.

Also illustrated in FIG. 5 are two spur lines 72 and 74 which extend at right angles to the main loop portion which it intersects. Such spur lines may be useful as links to process stations in situations where a more gradual curved tunnel section is not practical or where there are different elevations involved. A robot type load transfer mechanism 76 is employed to transfer a wafer carrier 23 and its load 24 from the main loop to the spur or vice versa. More specifically, by way of example, the transfer mechanism 76 will automatically, or by remote control, reach out and grasp the wafer carrier 23 which has been stopped at that intersection, lift the carrier and withdraw it out of the tunnel 2, move the carrier 90°, reach out and place it on a cart in the tunnel of the spur loop, and then withdraw. The transfer mechanism 76 is open to the tunnel 2 in the main and spur lines and also subjected to the purging gas to keep particulates away from the carrier load when the transfer is made.

Similar operations of the type illustrated can, of course, be employed in a wide variety of process situations utilizing the conveyor system of the invention. Several spur lines may lead from a central processing station surrounded by a conveyor loop leading to other stations. At a particular station, the carrier may be removed manually or automatically and placed into a processing apparatus.

FIGS. 12 and 13 show a turntable system 86 which can be used to change direction of the carts 11 and 19 either at the transfer mechanism 76 on a spur line, or at a corner of the track 1 which forms a sharp angle rather than a gradual curve as illustrated in FIG. 5. Turning to FIG. 13, the turntable system 86 includes a pneumatic rotary actuator 75, a turntable 77, an inner tunnel 78, a removable bottom plate 85, and a turntable housing 89. The pneumatic rotary actuator 75 is used to turn the turntable 77. The turntable 77 is formed to correspond in size and configuration to the track 1 as shown in FIG. 2, and has a series of short upstanding walls 77a through 77d which correspond to the series of short upstanding walls 1a through 1d shown in FIG. 2. The U-shaped inner cover 78 is received by the U-shaped grooves 77b on the turntable 77 to form an inner tunnel 88. This inner tunnel 88 corresponds in size and shape to the inner tunnel 6 of the straight sections of the track 1 shown in FIG. 2. The bottom plate 85, located below the turntable 77, is removable for servicing of the pneumatic rotary actuator 75 and the turntable 77. Also shown in FIG. 13 is a plenum 71 which is used to purge the atmosphere inside of the turntable 77 and the outer cover 4, and which mates with plenum 8 (FIG. 2). The turntable housing 89 sealably encloses the entire turntable system 86 to prevent contaminates from entering and contaminating the wafers 24.

The turntable housing 89 is larger than the outer cover 4 (FIG. 2), but has an internal adaptor plate 79 which is shaped to have an opening corresponding to the shape of the outer cover 4 and track 1 (FIG. 2). The adaptor plate 79 thus has openings to allow the carts to enter and leave the turntable 77, and provides appropriate openings as needed to allow communication with the plenum 8 and the space 51 in the cover 49 (FIG. 2). In short, the adaptor plate 79 defines a mating interface corresponding to the shape of the mating segment of track 1.

The turntable system 86 shown in FIGS. 12 and 13 is configured to interface with the track 1 (FIG. 12) in a substantially gas tight manner. To achieve this substantially gas tight interface, the ends of the turntable segment 77 and inner cover 78 are convex. The mating segments of track 1 and inner cover 5 has a correspondingly concave shaped interface or end. Thus, the convex end of turntable 77 can rotate into the concave end of track 1 and inner cover 5 to achieve a substantially gas tight joint.

When in use, pneumatic rotary actuator 75 rotates the turntable 77 to face the track 1 from which carts 11 and 19 are arriving. Referring now to both FIGS. 1 and 13, the inner tracks 77d are aligned with the inner tracks 1d so that the driver cart 11 can be moved onto the turntable 77. The inner cover 78 aligns with the inner cover 5 so that particles generated by the driver cart 11 do not escape into the outer tunnels 2 and 87. The outer rails 77c align with the outer rails 1c so that the driven cart 19 can be moved onto the turntable 77. The outer cover 79 aligns with the outer cover 14 so that the outer tunnels 2 and 87 form one continuous, substantially gas tight tunnel, thus protecting the wafers in the driven cart 19 from contamination. The turntable housing 89 inhibits contaminates from entering the tunnels 2, 4, 87 and 88 as the turntable 77 rotates between segments of track 1.

Using the turntable 77 to change the direction of travel of the carts 11 and 19 eliminates the particles generated by the wheels 12 and 20 when the carts 11 and 19 are moved on a curved track as found in curved corner 73 (FIG. 5). Moving the carts 11 and 19 on a curved track generates particles due to the sliding forces between the wheels and the rails. This sliding occurs radially to the curved track, or generally along the axis 13 of the wheels 12 and 20. The use of the turntable 77 to change the direction of travel of the carts 11 and 19 also allows for very sudden changes in direction of travel, and thus takes up less space than using curved tracks. Finally, the use of the turntable 77 allows simplified construction of the carts 11 and 19, inasmuch as they do not have to be capable of turning as the segmented carts 11 and 19 are designed to do. Rather, the turntable 77 allows the use of straight sections of track 1 for which single segmented carts are well suited.

The use of the turntable 77 enables the gradual curves in the track 1 to be replaced by right angle corners or skewed intersections of the track 1. As previously mentioned, the turntable 77 eliminates the need for curved sections of track 1 and therefore, eliminates the need for the two-segmented design of carts 11 and 19 as illustrated in FIGS. 1, 3, and 4. Without curves, there is no sliding of the carts 11 and 17 on the curve which in the two-segment cart design intended to minimize or eliminate.

FIG. 14 illustrates a one-segmented cart design for the driver cart 11 as well as illustrating an alternate embodiment of the electric pickup assembly 14. This one-segmented design is the preferred design when the track 1 includes or uses turntable system 86 instead of curved track 1. The single-segment driver cart 211 has a generally rectangular-shaped box for a body, the cross-section of which is a hollow rectangle. The driver cart 211 is mounted on four wheels 212 which are located at the front and back of the driver cart. The wheels 212 correspond to the wheels 12 on the two-segmented driver cart 11. With one exception to be described hereafter, the other major components of the driver cart 211 correspond to those of the driver cart 11 and will not be repeated here in detail.

This one exception is the electrical pickup assembly 214, one of which is located at each end of the driver cart 211, in front of the wheels 212. Each end of the driver cart 211 has an outwardly projecting flange 216 on the end of which is a downward depending or projecting flange 218 which is substantially parallel to the end of the driven cart 211. The flanges 216 and 218, in conjunction with the ends of the driver cart 211 form a channel 220 having a generally U-shaped cross-section. A post 222 extends through the edge of the outward projecting flange 216, generally down the center of the channel 220. A sliding block 224 is mounted on the end of post 222 which depends into the channel 220. The post 222 and sliding block 224 are free to slide vertically along the end of the driver cart 211 in an orientation which is perpendicular to the track 1, when the driver cart 211 is placed so that the wheels 212 ride on the inner rails 1d. A spring 226 is placed around the post 222 and between the outward flange 216 and the sliding block 224 so that the spring 226 resiliently urges the sliding block 224 away from the outward flange 216 and downward against the conductors 10. The sliding block 224 has a U-shaped cross-section which forms a yoke so that a contact wheel 228 can be rotatably supported in the sliding block 224.

In operation, the spring 226 resiliently urges the contact wheel 228 against one of the conductors 10 in track 1. The contact wheel 228 will rotate along the conductors 10 rather than sliding so as to minimize the particle generation from the electrical pickup. The contact wheel 228 is captivated by channel 220 so that it can slide up and down in order to accommodate variations or bumps in the vertical height of the conductor 10 and thus minimize wear or abrasion of any vertical variations in the height of the conductors 10. This minimized wear further reduces particle generation and contamination. An electrical conductor (not shown) conducts the electricity from the contact wheel 228 through the post 222 and to the motor (not shown) in the driver cart 211. There are, preferably, four contact wheels 228, two each being located at opposite ends of driver cart 211, and positioned so that the contact wheels 228 are resiliently urged against the conductors 10 when the driver cart 211 is placed on the inner rails 1d. Thus, two contact wheels 228, located at opposite ends of driver cart 211, roll upon the same conductor 10 in the track 1.

This alternate embodiment of driver cart 211 not only provides a single-segment construction which simplifies construction and manufacturing, but also uses an improved electrical pickup assembly 214 which provides for rolling contact with the electrical conductors 10 so as to minimize sliding abrasion of the conductors 10 which would generate particulate contaminants. Locating an electrical pickup assembly 214 at each end of a cart simplifies the electrical conductors 10. The conductors 10 need not provide electrical continuity across the juncture between two segments of track 1 since one pair of electrical pickups 214 will contact conductors 10 while the other pair of electrical pickups 214 is crossing the juncture or joint between segments of track 1.

FIG. 15 shows the construction of a one-segment driven cart 219. The one-segment driven cart 219 comprises two substantially vertical side walls 230 and a generally horizontal top piece 232 which is connected to the upper portions of the side walls 230. The top piece 232 forms a platform to support the wafer carrier 23. Four wheels 234 are rotatably mounted in cavities in the side walls 230. The sides 230 are relatively thick in order to increase their stiffness and rigidity. The mounting of the wheels 234 is analogous to the mounting of the wheels 20 on the two-segmented driven cart 19 and will not be repeated herein in detail. Similarly, plugs 21, steel spacer 21a, and magnets 25 are as previously described and will not be redescribed in detail herein other than to note that the components are mounted in apertures drilled in the side walls 230.

The single-segment construction of the driven cart 219 greatly reduces and simplifies the manufacturing of the driven cart 219. More importantly, the use of thicker material on the side walls 230 provides for increased stiffness and stability of the driver cart 219 riding on the outer rails 1c. The stiff sidewalls 230 do not flex or bend, and thus allow the wheels 234 to be accurately positioned on the outer rails 1c. As the driven cart 219 moves, the wheels 234 are maintained centered on the outer rails 1c and not allowed to flex and abrade against one side of the outer rails 1c. In one sense, the driven cart 219 is stiffer and allows tight dimensional and positioning tolerances to be maintained. Still further, the use of thicker sides 230 provides an increase in the mass of the driven cart 219 such that small bumps or perturbations in the smoothness of the outer rails 1c on which the driven cart 219 rides will have a less noticeable effect on vibrating the wafer carrier 23.

Referring to FIG. 6, there is schematically illustrated a portion of an industrial facility utilized for processing semiconductor wafers or some other product that requires cleanliness and a series of process steps. There is shown a series of rooms 80, 81, 82 and 83 which are intended to represent work areas at which various semiconductor wafer processing operations are conducted. As mentioned above, there may be a large number of such work areas within a particular facility and they may be arranged and located in a large variety of different ways. Thus, the layout illustrated is merely one small example of the manner in which the conveyer system of the invention may be utilized.

The single-segmented carts 211 and 219 can not be used on curved track sections without generating some particulate contaminats as the wheels slide on the curved track 1. When used in conjunction with the turntable system 86, and other particle reduction and containment features previously described, however, the single segmented carts 211 and 219 are capable of operating in a class 10 clean room environment. It is believed that this class 10 environment is achieved primarily by use of the low outgassing lubricants, the use of low friction, low particle generation materials—especially on the wheels 234 and track 1, and the containment of particles in the inner tunnel. The use of an air flow amplifier described hereinafter also contributes to achieving this low particulate level environment.

The environment in each of the rooms must be controlled to ensure a certain level of cleanliness. Typically, the rooms in which wafers are processed are Class 100 rooms which means that no more than 100 0.5 micron (0.00002 inches) particles parts per cubic foot of air are permitted. In some processing rooms, he requirement can be as high as class 10 (only 10 particles per cubic foot). Such cleanliness is obtained by utilizing suitable air circulation systems and filters that will produce the level of cleanliness desired. Since this adds expense to an operation, it is usually not practical to maintain large areas at this level of cleanliness, such that hallways or work areas 84 such as that illustrated extending between the "clean" rooms 80-83 are maintained at a lesser level of cleanliness. For example, that area might be maintained as a Class 10,000 or Class 100,000 level indicating that a maximum of 10,000 or 100,000 particles per cubic foot of air is permissible.

As has been explained above, it is undesirable that a batch of semiconductor wafers be moved from one clean room to another without being adequately protected from contaminates. The conveyor system of the invention provides such a suitable automatic means.

In each "clean" room 80-83 is positioned a work transfer or elevator station A, B, C, and D, respectively. A horizontal conveyor 90 of the type described above in connection with FIGS. 1-5, is shown extending through the upper front corner of each of the elevator stations and interconnecting the "clean" rooms 80-83. The conveyor is shown in FIG. 6 extending in a loop but, of course, other suitable configurations may be employed. The front wall of each elevator station is within the respective "clean" rooms, while the rear portion extends through the wall of a "clean" room and is positioned in the corridor area 84. In this way, the elevator stations occupy a minimum of space within the clean rooms. Also, the elevator stations may be serviced from the corridor area 84. The horizontal conveyor 90 is shown extending through the upper part of the "clean" rooms; however, if desired, the horizontal conveyor duct could also be positioned in the corridor area 84 by having the front wall of the work transfer stations 86-89 being substantially flush with an interior wall of its clean room.

Referring to FIG. 7 as well as FIG. 6, it may be seen that each of the elevator stations includes a vertically elongated box like housing 91 having a front wall 92, positioned in a "clean" room, a rear wall 93 positioned in the corridor area 84, and a pair of side walls 94 and a top wall 95 extending through the wall of the clean room. The housing 91 may be made of panels with corner supports or by other suitable construction to form an enclosure that is sealed sufficiently to maintain a controlled environment within the enclosure. A large portion of one side wall is open in the drawings simply for seeing the internal components, but the wall is normally closed.

Preferably, the controlled environment is accomplished by providing a continuous flow of clean air that produces a positive air pressure within the enclosure which prevents unfiltered air from entering the enclosure. The horizontal conveyor 90 is in communication with the interior of the housing 91 and hence the same air pressure source provided by the conveyor may be utilized for the transfer stations.

Within the front portion of the housing 91 is a load stall 98 which is accessible through the housing front wall 92 by way of a door 99. An unload stall 100 with its door 102 is positioned beneath the load stall 98. Each of the stalls 98 and 100 are also open at the rear so that a cassette load may be removed or inserted from the rear of the stalls.

Referring to FIG. 8, extending vertically on the back wall 93 of the housing is a so-called rodless air cylinder 104 having a carrier lug 106 extending laterally outwardly through the front wall of the cylinder 104. A rodless cylinder is an actuator in the form of a cylinder having a piston 105 slideably mounted therein but not having a piston rod. Instead, the lug 106 is attached directly to the piston within the cylinder 104 and air pressure is applied to the chambers in either side of the piston, through pneumatic connections 108a and b, causing the lug 106 to move up or down. The lug b extends through a vertical slot in the piston cylinder 164 that is provided with stainless steel sealing bands that permit the lug 106 to move vertically while continuously sealing the chambers above and below the piston 105. A product of this type is sold by Origa Corporation, 928 N. Oaklawn Avenue, Elmhurst, Ill. 60126.

The primary advantage of the product is that without a rod extending through the end of the cylinder 104, piston travel throughout most of the cylinder length can be obtained in a space no longer than the cylinder 104, which is a consideration in the arrangement shown in FIG. 8. Perhaps even more important in the present application is the fact that the device is very clean in that neither the mechanical movement, nor the clean air used to move the piston 105, generates much particulate matter that could contaminate the semiconductor wafers.

To further reduce particulate contamination of the wafers, the cylinder 104 is lubricated with a very low pressure grease and the vertical rodless air cylinder 104 is isolated from the wafer handling area by a sheet metal shroud 107 with an elongated vertical slot (not shown) to allow attachment of a robotics assembly 110. The shroud 107 is generally parallel to the rear wall 93 of housing 91. The space between the shroud 107 and the rear wall 93 is not under a positive pressure relative to the housing 91, thereby ensuring that any particles generated will not be forced into the pressurized wafer handling area.

Refer now to FIGS. 7-10, but especially to FIG. 9. Attached to the lug 106 is a robotics assembly 110 which includes a support arm 112 extending towards the load and unload stalls. Extending horizontally on the upper wall of the support arm 112 is a second rodless cylinder 114, which is similar to the cylinder 104 except that it is shorter and has a smaller diameter. The upward side of the horizontal cylinder 114 has an the elongated slot 115 (FIG. 9) and the sealing bands face upwardly with a lug 116 extending through the slot 115 and being connected to the piston 117 (FIG. 10) within the cylinder 114. Applying air pressure through the connections 109a or b 115 or 117 to the chambers formed on opposite sides of the piston 117 causes the lug 116 to be reciprocated horizontally towards or away from the load and unload stalls, 98 and 100 respectively.

Referring now to FIGS. 9 and 10, mounted on the upper surface of the lug 116 is a vertically extending piston and cylinder combination 118 which might be thought of as a pneumatic jack (hereinafter jack 118). Compressed air applied to the jack 118 through connections 119 and 121 (FIG. 10) raises or lowers the jack 118. Supported on the upper end of the piston (not shown) of the jack 118 is a horizontally extending plate 120 which is moved vertically by the pneumatic jack 118. A vertically extending linear bearing 122 is also connected to the horizontal plate 120 at one end and the lug 116 at the other end, and is located about one and one half inches from the jack 118. the linear bearing 22 further guides and stabilizes the vertical movement of plate 120. The horizontal plate 120 has a pair of laterally extending channels 124 formed in its upper surface, with a pair of elongated slots 126, located along the length of the channels 124 and extending through the plate 120 in each of the channels 124.

Positioned in each of the channels 124 is a pair of laterally spaced, schematically illustrated, horizontal actuators 130. The actuators 130 are adjustably positioned in the channels 124 by fasteners 134 and 135, (FIG. 10), that extend through the slots 126 to the actuator 130. The lateral adjustment of the actuators 130 is desirable since wafer cassettes are made of different widths to accommodate wafers of varying diameters. Each actuator includes a piston and cylinder arrangement (not shown) with the piston extending laterally outwardly along the length direction of the channels 124 and the slot 126, and being connected to a pair of elongated load pickup arms 132 that extend in cantilever fashion from the actuators 130 forwardly towards the load and unload stalls. The connection between the pistons and the support arms is schematically illustrated at 140 and 141 in FIG. 10. Each actuator has a pair of pneumatic hoses 136 and 137 (FIG. 9) connected to opposite ends of the chambers (not shown) formed by the piston within the actuator. Thus, by selectively applying air pressure to the chambers within the actuators 130, the support arms 132 may be moved in and out laterally.

The arms 132 are preferably made of aluminum treated with a Teflon impregnated, hard anodized finish for low friction and a smooth surface to eliminate particle generation not only from the arms after repeated usage, but also from the wafer cassette it is handled. Wafer carriers 23 are generally fabricated from plastic and are easy to scuff during movement.

The entire robotics assembly 110 is enclosed in a cover 142, preferably made of sheet metal in the shape of a box, which is sealed except for two elongated slot openings (not shown) through which the load pick up arms 132, pass. Enclosing the robotics assembly 110 reduces the number of particles that escape from the robotics assembly 110 into the wafer handling area. To further reduce contamination of the wafers, the arms 132 extend from the upper side of the robotics assembly 110, so that the driven cart 11 or 211, when grasped by the arms 132, is always located below the robotics assembly 110 so that gravity will tend to pull particles generated by the robotics assembly 110 down, away from the driven cart 19 or 219.

To still further reduce the number of particles generated by the robotic assembly 110, all of the cylinders in the robotics assembly 110 are lubricated with a very low vapor pressure grease. Finally, although the robotic assembly has been housed in a cover 142, a few particles generated by friction in the arms 132 will actually be carried back up through the elongated slots (not shown) in the cover 142 and contaminate the area near the driven cart 19 or 219. To eliminate this problem, an air amplifier jet (not shown) is positioned inside and to the rear of the cover 142, away from the engaged wafer carrier 23 (FIG. 9) between the shroud 107 and the back wall 93 (FIG. 8) where it removes small particles by suction and expels them into the nonpressurized area between the shroud 107 and the back wall 93, through the vertical slot (not shown) in the metal shroud 107.

Air flow amplifiers are low suction, high flow devices which make them ideal for exchanging the air within the box frequently and not allowing a build up of small particles over a period of usage. An air flow amplifier of this type is manufactured by Vortex Corporation, P. O. Box 14506, Cincinnati, Ohio 45263. Aspirators, fans or other means could also be used for the same purpose.

Various limit switches and other sensors (not shown) are provided to sense the vertical location of the lug 106, the robotics assembly 110 mounted on the arm 112, the horizontal location of the lug 116, the vertical location of the plate 120, and the lateral position of the cassette pick up arms 132.

The movement produced by the elevator and the robotics assembly is controlled by a general purpose programmable controller 150, schematically illustrated in FIGS. 7 and 8 as being positioned in the lower portion of the housing 91 and connected to the various sensors and limit switches. The controller 150 may be programmed to provide automatically the various sequence of movements desired by the elevator and robotics assembly 110. An example of such a controller is sold by Omron Tateisi Electronics Co. of Schaumburg, Ill. (Kyoto, Japan), under the model name Sysmac-P5R, as illustrated in their literature and identified as catalog number W12-E1-2.

FIGS. 7 and 9 show a control and indicator panel 154 mounted in the housing front wall 92 above the load stall 98 which panel 154 is connected to the controller 150 and includes control buttons for operating the system and indicators for indicating the status of operation.

OPERATION

Turning now to the operation of FIGS. 6–11, let us assume that it is desired to transfer a load of cassettes from "clean" room 80 to "clean" room 81. An operator approaches elevator A in room 80 and attempts to open the door 100 leading to the load stall 98. If the door 100 will open, it means that the load stall 98 is free to receive a load. An indication of this would be shown by a light adjacent to the word load on the control panel 154 in FIG. 11. If the door 100 cannot be opened, it means that a load is already there or is in process of being transferred such that the door 100 should not be opened at that time. A suitable interlock system of this type is desirable to avoid possible operator error in damaging the valuable semiconductor loads.

Assuming that the door 100 opens, the operator places a cassette load of wafers 160 (FIG. 7) into the load stall 98. The load should be positioned within a U-shaped guide (not shown) mounted on the floor of the stall 98, so as to place the load in proper position to be lifted by the pickup arms 132. Utilizing the control panel 154, the operator actuates the "send" button, FIG. 11, directing the controller 150 to send the load to elevator B in room 81. The controller 150 will know whether the horizontal conveyor is opened between elevators A and B such that a load can be moved through it. The various sensors included in the system tell the controller the location of the robotics assembly. Unless the robotics assembly 110 is already aligned with the load stall 98, it will move vertically to that position.

With the robotics assembly 110 aligned with the load stall 98, pneumatic pressure will be applied to the chamber on the rear side of the piston 117 in the cylinder 114, urging the lug 116 and the assembly mounted thereon forwardly towards the load stall 98. Either before or while this movement is in progress, the cassette pickup arms 132 will be spread laterally by the horizontal actuators 130. The pickup assembly will move forwardly to the broken line position indicated at 164 in FIG. 8, wherein the pickup arms 132 extend into the load chamber 98, straddling the sides of the cassette load 160 beneath outwardly extending flanges 162 (FIG. 9) on the cassette. The arms 132 will then be automatically moved towards the cassette load 160 to engage the sides of the cassette immediately beneath the flanges 162. Suitable sensing means (not shown) limit the movement of the arms 132 to provide the desired action. Once the arms 132 are positioned adjacent the cassette load 160, the pneumatic jack 118 extends slightly to lift the horizontal plate 120 together with the assembly mounted thereon including the pickup arms 132 and the load 160. The assembly carried on the lug 116 is then withdrawn to the solid line position shown in FIG. 8.

Following this operation, air pressure is applied to the bottom side of the piston 105 within the cylinder 104, raising the elevator to the upper broken line position 166 shown in FIG. 8. The robotics assembly 110 automatically moves forward so that the load 160 is carried by the pickup arms 132 through a hole in the back wall of the conveyor 90 and placed gently on the driven cart 19 or 219. The driven cart 19 or 219 is moved towards elevator B wherein the sequence is reversed. That is, the load 160 is grasped, lifted and withdrawn from the conveyor 90 to the retracted position at the upper end of the elevator. The load 160 is then moved downwardly by elevator B to the position represented by the broken lines in FIG. 8 wherein the robotics arm assembly 110 is aligned with the unload stall 100. The load 160 is then automatically moved forward and deposited in the unload stall 110.

Once this process has been completed, the lights on the control panel 154 will indicate that a load 160 is present in the unload stall 100, and an audible signal is also provided to let the operator in room 81 know that a load has arrived into that work area. The elevator station in FIG. 7 is provided with only a single load stall 98 and a single unload stall 100. However, in a production version of the system, a pair of unload stalls and load stalls are provided for each elevator, as is indicated on the control panel 154 (FIG. 11). This use of multiple stalls permits more cassette loads to be cycled at a single time. Of course, the number of stalls and the number of elevator stations employed may be selected as desired, and the controller 154 programmed accordingly.

Throughout the operation of the system, clean air is provided in the conveyor duct and within the elevator station housings under a positive pressure so that there is a continual leakage air flow out of those chambers, thus ensuring that contaminates do not enter the chambers.

In addition to the automation illustrated herein, apparatus may be provided for automatically installing or removing loads from or inserting loads into the elevator stations.

What is claimed is:
1. Apparatus for transporting a cassette of semiconductor wafers, from a first clean room, having a specified maximum number of particulate contaminates for a given volume of space, to a second clean room, comprising:

a first elevator station in said first clean room, said first elevator station including a housing enclosing both a chamber and a load receiving stall, both of which have a controlled environment;
first mechanical transfer means for extending into said stall and withdrawing the load to an elevator position within the chamber, said transfer means being laterally movable to releasably engage said load;
an elevator in said first elevator station for moving said first transfer means and the load to a desired level;
conveying means in a controlled environment for receiving the load from said first transfer means and for conveying said load to a second transfer means for withdrawing said load from the conveying means, said conveying means comprising:
an elongated, track-like support having a pair of inner tracks on the upper side of the support;
means on said support located between said inner tracks for conducting electrical power;
a driver cart riding on said inner tracks;
an electric motor included with the driver cart;
an electrical power pickup on the driver cart for transferring electricity from the power conducting means to the electric motor;
a generally U-shaped inner cover supported in an inverted orientation on said track-like support to form, with the support, an inner tunnel through which said driver cart can travel, said support having means spaced outwardly from said inner tracks to sealingly cooperate with the lower edges of the side legs of said cover;
a pair of outer tracks on said support including a track on each side spaced outwardly from but in close proximity to the means on the support for receiving the lower legs of said cover;
a driven cart having a generally U-shaped support structure positioned in an inverted orientation with an upper support surface and depending side legs, and having wheels rotatably mounted on the lower ends of said structure side legs, the driven cart wheels being aligned to ride on said outer tracks, with the side legs of the driven cart structure being spaced outwardly from the side legs of the inner cover to straddle and enclose the inner cover and the driver cart, said driven cart including an upper wall of the inner cover, said upper support surface being adapted to support a wafer cassette, remote from the wheels on said driven cart;
magnetic means on said driver cart extending outwardly in close proximity to the inner surface of said inner cover, and magnetic means on said driven cart structure extending closely adjacent to the outer surface of said inner cover and aligned with the magnetic means on said driven cart so that sufficient magnetic force can be exerted by the magnetic means on the driver cart to cause the driven cart to follow the motion of the driver cart;
an outer, generally U-shaped cover supported in an inverted orientation and fitting over the driven cart and the space to be occupied by said cassette on top of the driven cart so that the outer cover in combination with the inner cover and said support forms an outer tunnel through which said driven cart can travel, said support being formed with means on its upper surface spaced outwardly from said outer tracks for sealingly cooperating with the lower ends of the side legs of the outer cover;

a second elevator station in said second clean room, including a housing having a controlled environment and further including said second transfer means;

an unload stall and a second elevator cooperating with said second transfer means to move the load to the level of said unload stall and move the load into said unload stall; and means for controlling the operation of the transfer means, the elevators and the conveying means to transfer a load from one elevator station to the other.

2. The apparatus of claim 1 wherein said first elevator station includes an unload stall and said second elevator station includes a load stall, and wherein said control means can control travel of said cassette to or from at least one of said elevator stations.

3. A system for transferring a cassette of semiconductor wafers from a first location to a second location in a manner which will keep the cassette and wafers in a controlled environment, having a limited number of particles per unit volume of space, during the transfer, comprising:

means defining a first elevator station positioned in said first location and means defining a second elevator station positioned in said second location, each of said elevator stations including means defining a vertically extending enclosure, a load stall adjacent one wall of the enclosure and a door in said enclosure wall for inserting or withdrawing a cassette and wafers from the enclosure, a vertically extending elevator in said enclosure spaced from said stall, and a transfer mechanism movable vertically by the elevator, said transfer mechanism including means for withdrawing or inserting said cassette and wafers from or into said stall;

a horizontal conveying means in communication with each of said enclosures, said conveying means being vertically spaced from said stalls, for horizontally transferring said cassette and wafers between said stations, said transfer mechanism further including means for withdrawing or placing said cassette and wafers onto said horizontal conveying means, said horizontal conveying means comprising:

a support structure having a first surface which contains a conducting means for conducting electrical power, at least one inner track which is substantially parallel to said means for conducting electrical power, and at least one outer track which is substantially parallel to said inner track;

a wheeled driver cart having at least two wheels in communication with said inner track, said driver cart being driven by an electric motor mounted on said driver cart, said driver cart also having a power transfer means for transferring electrical power from the electrical conducting means of the support structure to the electric motor on the driver cart;

an inner cover made of magnetically permeable material which is attached to said support structure so as to form a substantially gas tight tunnel enclosing said driver cart and inner track;

a wheeled driven cart which straddles said inner cover and has at least two wheels in communication with said outer track, said driven cart containing magnetic means positioned to coincide with the location of a corresponding magnetic means located on said driver cart so that sufficient magnetic force can be exerted by said magnetic means on the driver cart to cause the driven cart to track the motion of the driver cart, said driven cart also having wheels formed of a low-friction, corrosion-resistant material to further reduce particulate generation, said wheels being attached to the axles of said driven cart by low friction, low particle generating bearings, and said driven cart carrying said cassette and wafers;

an outer cover attached to the support structure, said outer cover substantially enclosing the driven cart and outer track to form an outer tunnel in which the driven cart can travel, said outer tunnel being substantially free of particles which can damage said wafers being transported on said driven cart and shields on said driven cart partially enclosing each of said wheels on said driven cart in order to deflect any particles generated away from wafers in said cassette which is supported on the upper surface of said driven cart; and means for controlling the operation of the elevators and the transfer mechanisms whereby a cassette and wafers may be withdrawn from a load stall in one station, moved to a different elevation, inserted onto the driven cart, moved horizontally to the second station, withdrawn from that station, moved vertically to the level of the load stall in the second station, and then placed into the second stall.

4. The system of claim 3, wherein the load stall and the door in said enclosure opening to the load stall in each of said elevator stations is positioned at an elevation convenient for manual removal or insertion of the cassette and wafers into the enclosure, and said conveying means is spaced vertically from the load stall so that it does not interfere with work space between the first and second elevator stations.

5. The system of claim 3 wherein at least one of said transfer mechanisms includes a pair of pick-up arms which lift and move said cassette and wafers.

6. The system of claim 3 including a control panel on a wall of at least one of said enclosures, the panel having means for initiating and stopping operation of the transfer mechanism and having indicating means indicating the location of said cassette and wafers within said system.

7. Apparatus for handling a load which is to be moved from a first work area to a second area remote from the first work area comprising:

a horizontal conveyor supported at a level above the work areas, said horizontal conveyor comprising:

an elongated, track-like support having a pair of inner tracks on the upper side of the support;

means on said support located between said inner tracks for conducting electrical power;

a driver cart riding on said inner tracks;

an electric motor included with the driver cart;

an electrical power pick-up on the cart for transferring electricity from the power conducting means to the electric motor;

an inner cover supported in an inverted orientation on said track-like support to form, with the support, an inner tunnel through which said driver cart can travel, said support having means spaced outwardly from said inner tracks to sealingly cooperate with the lower edges of the side legs of said cover;

a pair of outer tracks on said support including a track on each side spaced outwardly from but in close proximity to means on the support for receiving the lower legs of said inner cover;

a driven cart having a generally U-shaped support structure positioned in an inverted orientation with an upper support surface and depending side legs, and having wheels rotatably mounted on the lower ends of said structure side legs, the driven cart wheels being aligned to ride on said outer tracks, with the side legs of the driven cart structure being spaced outwardly from the side legs of the inner cover to straddle and enclose the inner cover and the driver cart, said driver cart including an upper support surface spaced above and extending over the upper wall of the inner cover, said upper support surface being adapted to support a load, remote from the wheels on said driven cart;

magnetic means on said driver cart extending outwardly in close proximity to the inner surface of said inner cover, and magnetic means on said driven cart structure and extending closely adjacent to the outer surface of said inner cover and aligned with the magnetic means on said driver-cart so that sufficient magnetic force can be exerted by the magnetic means on the driver cart to cause the driven cart to follow the motion of the driver cart; and an outer generally U-shaped cover arranged in an inverted orientation fitting over the driven cart and the space to be occupied by said load on top of the driven cart so that the outer cover in combination with the inner cover and said support forms an outer tunnel through which said driven cart can travel, said support being formed with means on its upper surface spaced outwardly from said outer tracks for sealingly cooperating with the lower ends of the side legs of the outer cover;

an elevator station located in said first work area including a vertically elongated housing, with the horizontal conveyor being in communication with the upper portion of said vertically elongated housing;

a load receiving stall in said vertically elongated housing at a level spaced below the horizontal conveyor which is convenient to receive said load from said first work area; and load transfer means for removing said load from said stall, elevating it to said horizontal conveyor, and placing it on the driven cart so said driven cart can transport said load along said horizontal conveyor.

8. The apparatus of claim 7 wherein said load transfer means includes a pair of pickup arms and means for moving the pair of pickup arms to cause the pair of pickup arms to extend into said stall, move laterally to engage the load, move vertically to lift the load, and retract to withdraw the load from the stall.

9. The apparatus of claim 8 wherein said load transfer means further includes means for elevating the load and said pair of pickup arms and said means for moving said pickup arms to the level of said horizontal conveyor and wherein the means for moving said pair of pickup arms is capable of moving said pair of pickup arms to place the load on the driven cart.

10. The apparatus of claim 7 wherein the load transfer means elevates said load by use of a vertically oriented rodless cylinder having a wall with an aperture through said wall, said rodless cylinder further having a piston and a load carrying leg attached to the piston, said leg extending through said aperture in said wall of the cylinder to support said pair of pickup arms and the means for moving said pair of pickup arms.

11. The apparatus of claim 10 wherein said load transfer means comprises:

a pair of pickup arms which can be adjustably spaced apart to engage loads of differing sizes; and a horizontally extending rodless cylinder having a piston and a lug extending through a wall of said cylinder to move said pair of pickup arms to engage and disengage said load.

12. The apparatus of claim 11 wherein said load transfer means further comprises:

a pneumatic jack having a first side, a horizontal support plate mounted on said first side of the jack, a plurality of horizontal actuators mounted on said plate, said plurality of actuators supporting said pair of pickup arms so as to move said pair of pickup arms laterally to engage and disengage said load.

13. Apparatus for transporting a cassette of semiconductor wafers, from a first "clean" room having a specified maximum number of particles per unit volume of space, to a second "clean" room, comprising:

a first elevator station in said first clean room; a second elevator station in said second clean room;

conveyor means extending between said first and second elevator stations at a level which does not interfere with activities in said first and second clean rooms or the space between said first and second clean rooms at ordinary working heights, said conveyor means transporting said cassette of semiconductor wafers from said first station to said second station while minimizing the generation of particulate contaminates and maintaining the level of particulate contaminates to a predetermined level, said conveyor means comprising:

a support structure having a first surface which contains a conducting means for conducting electrical power, at least one inner track which is substantially parallel to said means for conducting electrical power, and at least one outer track which is substantially parallel to said inner track;

a wheeled driver cart having at least two wheels in communication with said inner track, said driver cart being driven by an electric motor mounted in said driver cart, said driver card also having a power transfer means for transferring electrical power from the electrical conducting means of the support structure to the electric motor on the driver cart;

an inner cover made of magnetically permeable material which is attached to said support structure so as to form a substantially gas-tight tunnel enclosing said driver cart and inner track;

a wheeled driven cart which straddles said inner cover and has at least two wheels in communication with said outer track, said driven cart containing magnetic means positioned to coincide with the location of a corresponding magnetic means located on said driver cart so that sufficient magnetic force can be exerted by said magnetic means on the driver cart to cause the driven cart to track the motion of the driver cart, where the wheels of said driven cart are formed of a low-friction, corrosion-resistant material to further reduce particulate generation, said wheels being attached to the axles of said driven cart by low friction, low particle generating bearings, and said driven cart carrying said cassette of semiconductor wafers;

an outer cover attached to the support structure, said outer cover substantially enclosing the driven cart and outer track to form an outer tunnel in which the driven cart can travel, said outer tunnel being substantially free of particles which can damage said wafers being transported on said driven cart; and shields on the driven cart partially enclosing each of said wheels on said driven cart in order to deflect any particles generated away from wafers in said cassette supported on the upper surface of said driven cart; and transfer means in each of said elevator stations for receiving and transferring said cassettes and wafers to and from the conveyor means and for moving the cassettes and wafers vertically to and from the ordinary working heights to the level of the conveyor means.

14. The apparatus of claim 13 wherein said first and second elevator stations each includes a housing which encloses the transfer means and the interconnection between the conveyor means and the first and second elevator stations, said housing enabling said controlled environment to be maintained around the transfer means, said conveyor means including means for conducting clean pressurized air through the conveyor means to control the environment in the conveyor means.

15. A system for moving semi-conductor wafers, while maintaining at least a class 100 environment, comprising:

a container for holding said wafers during moving;

a first station located in a clean room environment, comprising:

a loading stall having a door through which said container can be inserted into said stall;

a first container transfer mechanism for moving said container from said loading stall to a conveyor as described later; and a first housing enclosing said loading stall and said transfer mechanism, said housing being pressurized to inhibit contaminants from entering said housing; a second station comprising:

an unloading stall having a door through which said container can be removed from said stall;

a second container transfer mechanism for removing said container from said conveyor and inserting said container into said unloading stall, and;

a second housing enclosing said unloading stall and said second container transfer mechanism said second housing being pressurized to inhibit contaminants from entering said second housing;

a conveyor communicating with said first and second stations to move said container from said first station to said second station, said conveyor being designed to minimize the generation of contaminates during the movement of said container between said stations, said conveyor comprising:

a generally flat, track-like extruded member made of Teflon-impregnated hard anodized aluminum, said extruded member haing elongated recesses formed therein, and having elongated rails forming tracks;

a wheeled driven cart supported for movement along said tracks wherein the portions of the driven cart which engage said tracks are treated to be Teflon-impregnated, hard anodized aluminum, said driven cart supporting said container during movement between said first and second stations, said driven cart cooperating with said transfer mechanisms to receive from and transfer said container to said transfer mechanisms;

a wheeled driver cart supported for movement along said tracks, said driver cart using magnetic coupling to drive said driven cart; and cover means cooperating with said recesses in said support structure to form a first tunnel for enclosing said driven cart and isolating said driven cart and said container from said driver cart, said cover means cooperating with said said recesses in said support structure to form a second tunnel for enclosings said driven cart and container, said second tunnel communicating with and cooperating with said first and second housings to maintain a pressurization in said second tunnel and in said first and second housings to inhibit contaminants from entering said first and second housings and from entering said second tunnel.

16. A system as defined in claim 15, further comprising:

an elevator supporting at least one of said first and second container transfer mechanisms in order to move said container between said conveyor and one of said loading and unloading stalls when said conveyor and said one of said loading and unloading stalls are located at different heights.

17. A system as defined in claim 15, wherein said conveyor further comprises:

turntable means aligned with a section of said track for rotating a segment of said track, and any supported driver and driven carts on said track segment through an angle to bring said track segment into alignment with a different section of said track so that the direction of said driver and driven carts on said track segment can be changed, and wherein said turntable means includes said cover means, and wherein said cover means sealably engage with corresponding cover means on said different track section of said track to allow continued pressurization of said second tunnel and at least one of said first and second housings.

18. A system as defined in claim 17, wherein said system can maintain a class 10 environment by further including:

bearings on said wheeled driver and driven carts having a low out-gassing lubricant in the bearings of said carts; and low friction, low particle generation materials on said track and wheeled carts.

19. A system for moving semi-conductor wafers, while maintaining said wafers in at least a class 100 environment, comprising:

a first station comprising:

a load receiving stall for receiving a load of wafers;

a first load transfer means for moving said load of wafers from said load receiving stall;

a first station housing enclosing said load receiving stall and said first load transfer means; and pressurizing means for maintaining a positive pressure in said first station housing to inhibit particles from entering said first station; a second station comprising:

an unloading stall for receiving a load of wafers;

a second load transfer means for inserting said load into said unloading stall;

a second station housing enclosing said unloading stall and said second load transfer means; and pressurizing means to maintain a positive pressure in said second station housing to inhibit particles from entering said second station;

conveying means communicating with said first and second stations for moving said load from said first station to said second station, said conveying means being designed to minimize the generation of contaminates during the movement of said load between said stations, said conveying means comprising:

a support structure having a first surface which contains a conducting means for conducting electrical power, at least one inner track which is substantially parallel to said means for conducting electrical power, and at least one outer track which is substantially parallel to said inner track;

a wheeled driver cart having at least two wheels in communication with said inner track, said driver cart being driven by an electric motor mounted on said driver cart, said driver cart also having a power transfer means for transferring electrical power from the electrical conducting means of the support structure to the electric motor on the driver cart;

an inner cover made of magnetically permeable material which is attached to said support structure so as to form a substantially gas tight tunnel enclosing said driver cart and inner track;

a wheeled, driven cart which straddles said inner cover and has at least two wheels in communication with said outer track, said driven cart containing magnetic means positioned to coincide with the location of a corresponding magnetic means located on said driver cart so that sufficient magnetic force can be exerted by said magnetic means on the driver cart to cause the driven cart to track the motion of the driver cart, said driven cart also having wheels formed of a low-friction, corrosion-resistant material to further reduce particulate generation, said wheels being attached to the axles of said driven cart by low friction, low particle generating bearings, and said driven cart carrying said load of wafers;

an outer cover attached to the support structure, said outer cover substantially enclosing the driven cart and outer track to form an outer tunnel in which the driven cart can travel, said outer tunnel being substantially free of particles which can damage said wafers being transported on said driven cart;

pressurization means in said outer cover for maintaining a positive pressure in said outer cover to inhibit particles from entering said outer cover, said outer cover communicating with and cooperating with said first and second housings to maintain pressure in said outer cover and said first and second housings; and shields on the driven cart partially enclosing each of said wheels on said driven cart in order to deflect any particles generated away from wafers in a wafer carrier supported on the upper surface of said driven cart.

20. A system as defined in claim 19, further comprising:

elevator means for supporting at least one of said first and second load transfer means in order to move said load of wafers between said conveying means and one of said receiving and unloading stalls when said conveying means and said one of said receiving and unloading stalls are located at different heights.

21. A system as defined in claim 19, further comprising:

a second unloading stall in said first station and a second receiving stall in said second station, as previously defined, for respectively unloading and loading loads out of or into said stations.

22. A system as defined in claim 20 wherein said elevator means is moved by a rodless air cylinder.

23. A system as defined in claim 21 further comprising:

control means for controlling the operation of said first and second load transfer means and said conveying means, to transfer a load between said first and second stations.

24. A system as defined in claim 21, further comprising:

suction means for removing particles from at least one of said load transfer means so as to inhibit contamination of said load.

25. A system as defined in claim 19, wherein said conveying means further comprises:

a rotatable segment comprising said support structure, inner cover, outer cover, and pressurization means, said rotatable segment being rotatable about an axis to sealingly and operably engage with corresponding support structure, inner cover, outer cover and pressurization means on a different section of said system; and turntable means for rotating said rotatable segment and any supported driver and driven carts on said segment, through an angle to bring said rotatable segment into alignment with a different section of said system so that the direction of said driver and driven carts on said rotatable segment can be changed.

26. A system as defined in claim 25 wherein said driver and driven carts comprise one segmented, wheeled carts using low out-gassing lubricants on their wheel bearings, and low particle generation materials on said wheels and on said track means in order to achieve and maintain a class 10 environment.

27. A system as defined in claim 25, further comprising:

suction means for removing particles from at least one of said load transfer means so as to inhibit contamination of said load.

28. A system as defined in claim 25, further comprising:

control means for controlling the operation of said first and second load transfer means and said conveying means, to transfer a load between said first and second stations.

* * * * *